(12) United States Patent
Bourdillon

(10) Patent No.: US 6,433,573 B1
(45) Date of Patent: Aug. 13, 2002

(54) METHOD AND APPARATUS FOR MEASURING PARAMETERS OF AN ELECTRONIC DEVICE

(75) Inventor: Laurence A. Bourdillon, New Milford, CT (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 34 days.

(21) Appl. No.: 09/633,761

(22) Filed: Aug. 7, 2000

(51) Int. Cl.[7] .......................... G01R 31/26; G05F 3/16; H01L 21/00; G11C 11/24
(52) U.S. Cl. ................ 324/765; 324/768; 324/763; 327/546; 438/10; 365/149
(58) Field of Search ................ 324/765, 768, 324/769, 755, 763; 327/546; 438/10, 17, 18, 210; 365/149

(56) References Cited

U.S. PATENT DOCUMENTS

| | | | |
|---|---|---|---|
| 4,791,610 A | 12/1988 | Takemae | 365/149 |
| 4,864,374 A | 9/1989 | Banerjee | 357/23.6 |
| 4,994,904 A | 2/1991 | Nakagawa et al. | 357/23.4 |
| 5,382,818 A | 1/1995 | Pein | 257/347 |
| 6,046,627 A | 4/2000 | Itoh et al. | 327/546 |
| 6,188,234 B1 * | 2/2001 | Abadeer et al. | 324/766 |

OTHER PUBLICATIONS

"Measurement of Substrate Current in SOI MOSFET's", by C.T. Nguyen et al., IEEE Electron Device Letters, vol. 15, No. 4, Apr. 1994, pp. 132–134.

* cited by examiner

Primary Examiner—N. Le
Assistant Examiner—Anjan K. Deb

(57) ABSTRACT

The inherent capacitance between the substrate and the drain of an SOI device is utilized as part of a circuit. The substrate is connected to a sensing pin brought external to the chip, and other electronic components are hooked up to form a circuit that includes and operates with the inherent capacitance between the substrate and the drain.

19 Claims, 4 Drawing Sheets

FIG. 1
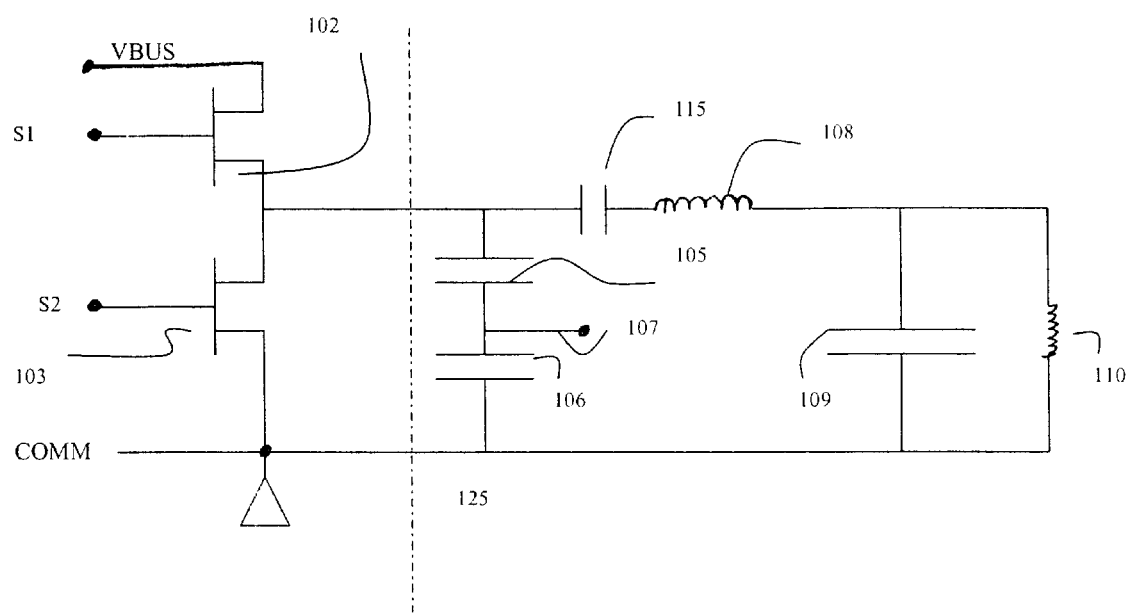
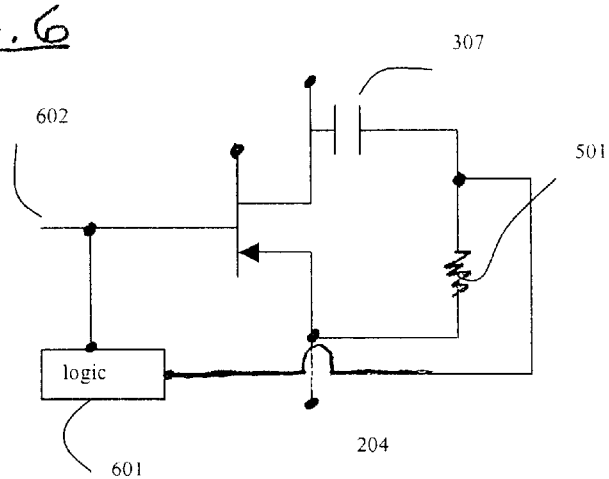
FIG. 6

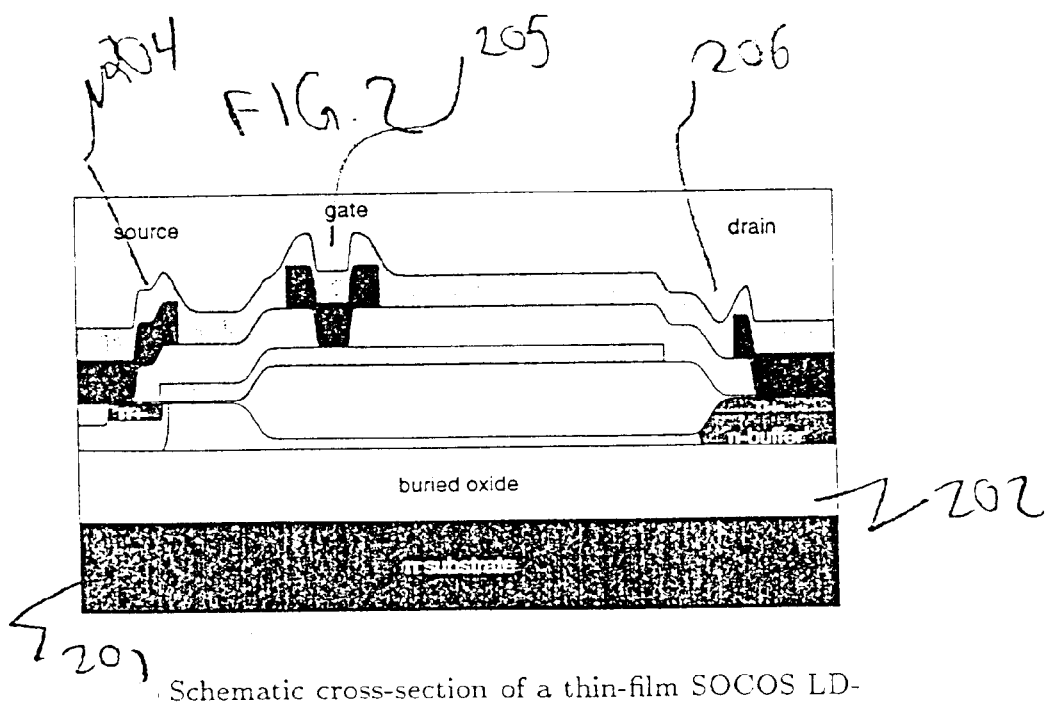
Schematic cross-section of a thin-film SOCOS LD-

FIG. 3
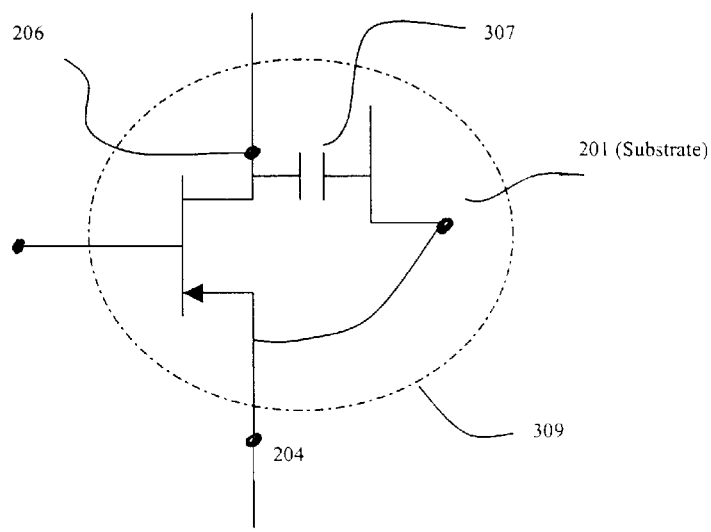
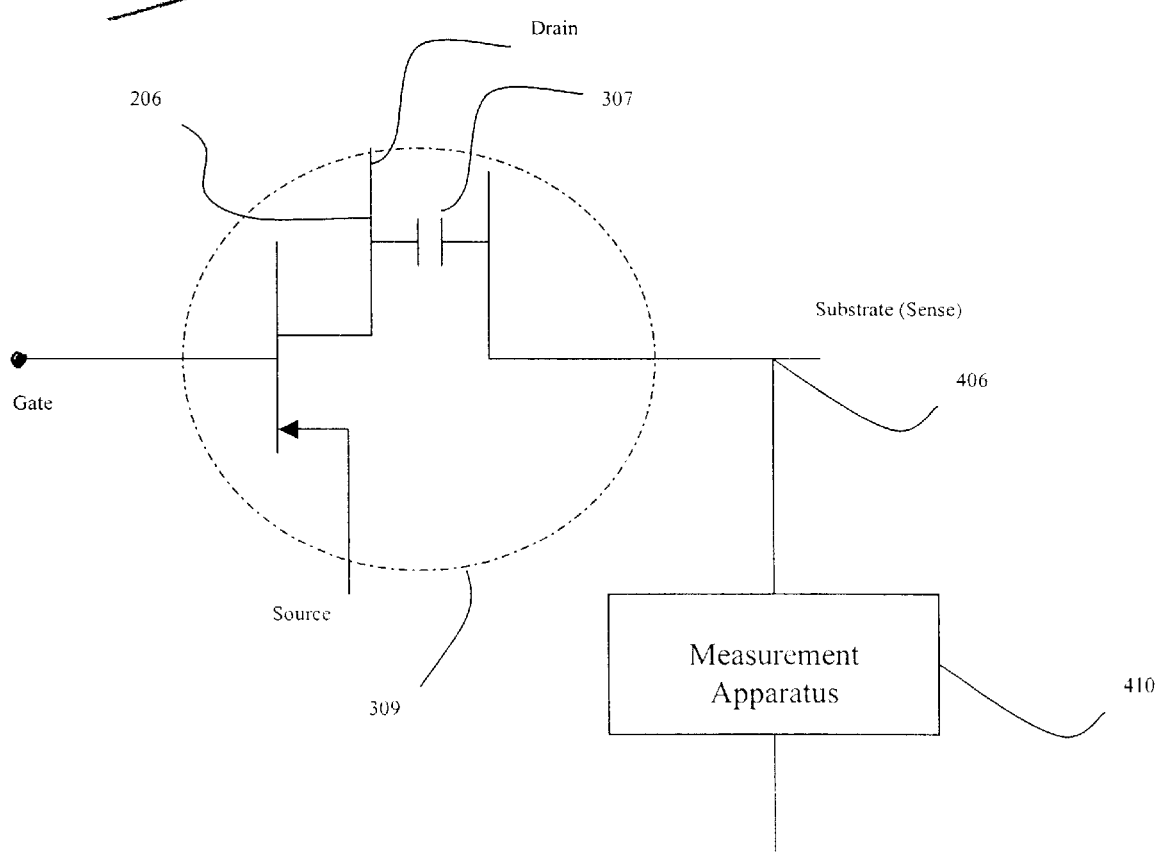

METHOD AND APPARATUS FOR MEASURING PARAMETERS OF AN ELECTRONIC DEVICE

TECHNICAL FIELD

This invention relates to electronics, and more specifically, to an improved technique of measuring parameters within Silicon on Insulator (SOI) and similar devices.

BACKGROUND OF THE INVENTION

FIG. 1 shows an exemplary prior art configuration of two semiconductor devices 102 and 103 configured with other elements to form a half bridge circuit. The devices may be MOS devices, SOI, or other type. The devices are typically manufactured using known techniques in which the various required layers are deposited on a substrate 201 as shown in FIG. 2. Devices 102 and 103 are each usually fabricated on a chip, and border 125 represents the external boundaries of the chips.

As FIG. 1 shows, one standard application includes the use of external capacitors 105 and 106 in order to measure the output of the half bridge. A sensing lead 107 is usually connected outside of the chip on which the SOI devices 102 and 103 reside. The sensing lead may be used for taking measurements using standard equipment. The remainder of the external elements, inductor 108, capacitors 109 and 115 and resistor 110, are arranged to form a standard resonant output circuit.

In operation, high voltage capacitor 105 transfers AC signals to sensing lead 107 and such signals are sent to a measurement device in order to monitor operation of the SOI devices from an external piece of equipment. While the arrangement is basically satisfactory, the use of external components increases the cost and decreases the reliability.

The external monitoring is required in a variety of applications. For example, it is desirable in some switching circuits to maintain operation of the device in what is termed the soft switching region. The only way to accomplish this objective is to monitor the operation of the device and provide correction if the hard switching region is approached.

In view of the foregoing, it would be desirable to construct a sensing apparatus that does not require so many additional components. It would also be desirable to minimize manufacturing costs of such devices. It is also a desirable object to eliminate the need for an additional external capacitor.

SUMMARY OF THE INVENTION

The above and other problems of the prior art are overcome in accordance with the present invention, which relates to a technique of implementing the required capacitor for sensing without the additional cost and connections typically required in the prior art. More specifically, a separate sensing lead is run from the substrate of the device to an external pin. The inherent residual capacitance between the substrate and the drain is utilized as the sensing capacitor. This residual capacitance is usually deemed an unwanted parasitic capacitance. Applications include utilizing this internal sensing capacitor to control logic gates, to regulate or control external devices, or to maintain a device in the soft switching region. In alternative embodiments, the inherent capacitance between the substrate and other portions of the device (e.g. the gate or the source) may also be used.

BRIEF DESCRIPTION OF THE DRAWINGS

FIG. 1 is an example of a prior art arrangement with an SOI device and several external capacitors;

FIG. 2 represents a cross section of the physical structure of an SOI device;

FIG. 3 depicts an exemplary prior art arrangement showing the conventional internal connection of the source to the drain;

FIG. 4 shows an exemplary arrangement of a device connected in accordance with the present invention;

FIG. 6 depicts the use of the present invention in conjunction with one or more external logic gates.

DETAILED DESCRIPTION OF THE PREFERRED EMBODIMENT

Figure 5:
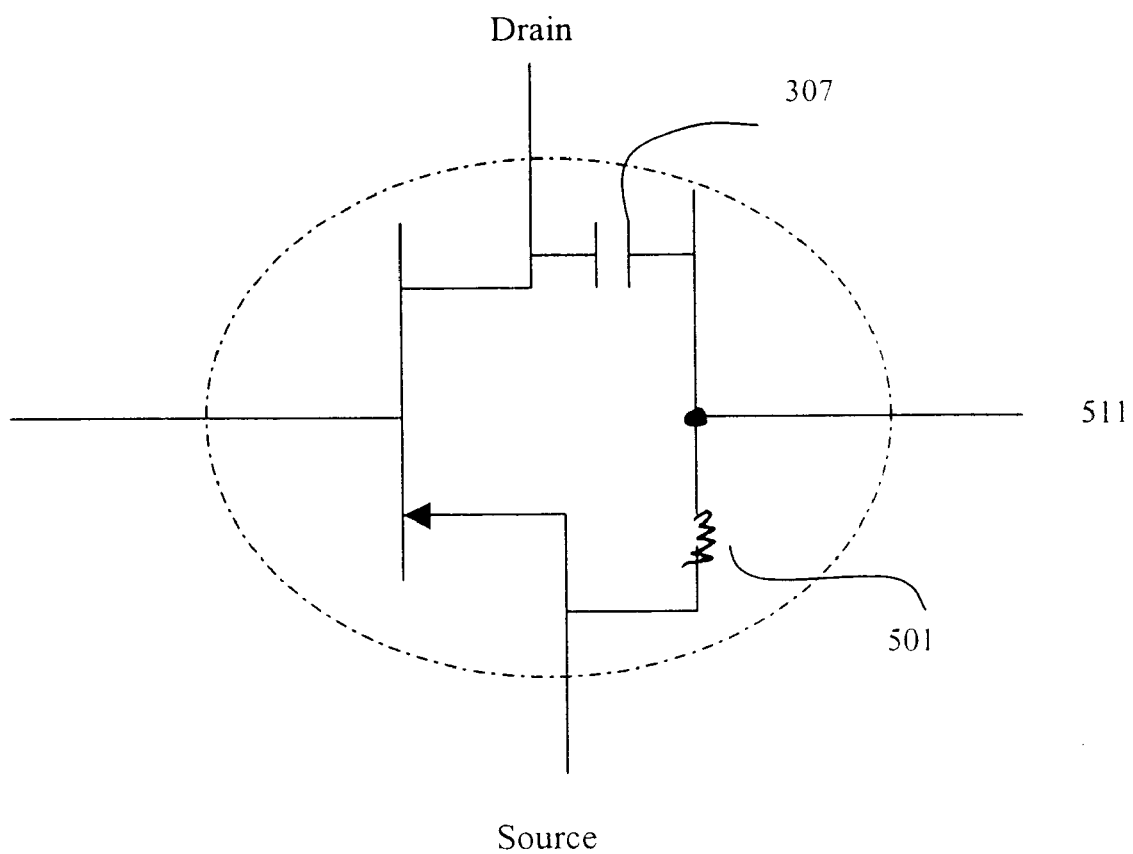
FIG. 5 shows a further exemplary embodiment of the present invention.

FIG. 2 shows a cross section of a typical SOI device including a substrate layer 201, and a buried oxide layer 202. The remaining layers are shown in accordance with standard manufacturing techniques for such devices. The device includes a source 204, a gate 205, and a drain 206. There are a variety of such devices commercially available, and the particular specific device utilized is not critical to the present invention.

In typical applications, the substrate layer 201 is connected directly to the source layer as indicated pictorially in FIG. 3. Such a connection is internal to a semiconductor chip, as shown in FIG. 3, the dashed border 309 representing the outer boundaries of the device. Often, a single outer package will include three terminals, representing the source, gate and drain, and a small tab also connected to the drain.

The use of the external capacitors 105 and 106 in FIG. 1 fails to take advantage of the inherent capacitance between the substrate 201 and the drain 206, as indicated as capacitance 307 in FIG. 3. This capacitance is simply a result of the physics inherent in the production of these devices, the size thereof, and other parameters. The inherent capacitance 307 is readily calculable by those of skill in the art and exists on the device without any additional cost. The value of capacitor 307 depends upon the size of the drain, the area of the substrate 201 of FIG. 2, and the area of the buried oxide layer 202.

More specifically, referring to FIG. 2, the capacitance is formed because the buried oxide layer 202 acts as an insulator between the drain 206 and substrate 201. The drain 206 and substrate 201 then act as the plates of a capacitor. Thus, the standard equations for calculating the capacitance of a parallel plate capacitor may be used.

It is noted that there also exists an inherent capacitance between the substrate layer 201 and any other portions of the device above buried oxide layer 202. The drain/substrate capacitance was chosen to utilize because the typical area of the drain is large enough to provide a higher valued capacitor, which is typically what is needed in the measurement circuitry to ensure operation within the soft switching region. We therefore use herein as the example for explanation purposes the drain substrate capacitance. However, the present invention is not intended to exclude use of the substrate/gate capacitance, or the substrate/source capacitance as valuable measurement elements.

As indicated in FIG. 4, the present invention contemplates that the source and substrate will not be internally connected. Instead, a separate pin is taken from the substrate out to the outside of the device for measurement purposes. One convenient technique involves the use of a small tab on the outside of the device package. More specifically, the tab on the outside of parts such as a standard TO-220, sometimes used as a heat sink and often connected to the drain, may be connected to the substrate instead of to the drain. This allows conventional device packaging to be utilized with no modification.

As shown in FIG. 4, the sense pin 406 may then be connected external to the device to a measurement apparatus. The measurement apparatus 410 is connected to the sense 406 and to a common ground. Since the capacitor 307 passes varying signals but suppresses DC, the substrate sense 406 of FIG. 4 is a signal that represents the derivative of the drain voltage.

The drain/substrate capacitance 307 is thus utilized as a sensing mechanism. More specifically, the current out of the capacitor 307 is a measure of the change in voltage at the drain 206 with respect to time. Since this inherent capacitor provides the necessary signal, the external capacitor 105 can be eliminated.

FIG. 5 shows an embodiment of the present invention in which a resistor 501 is placed in series with the internal capacitance 307. The resistor is fabricated on the chip with the SOI device in accordance with conventional techniques for depositing a resistor. A sensing pin 511 is then brought external to the chip, and the sensing pin represents a voltage division between capacitor 307 and internal resistor 501. Thus, in the embodiment of FIG. 5, the inherent capacitance 307 is used as part of a voltage divider circuit.

FIG. 6 shows still another exemplary embodiment of the present invention comprising the inherent capacitance 307 in series with the internal resistor 501 previously discussed. This time a set of logic 601 is added to the sensing point to control an output present at pin 602. The logic receives a signal proportional to the rate of change of voltage across capacitor 307. The logic may be used to control that gate (e.g., shut it off if the change in voltage is too rapid). Note that logic 601 may include one or more logic gates and functions on the chip or external thereto.

While the above discussion is with respect to the inherent capacitance between the drain and the substrate, there is also a capacitance between the substrate and the gate, as well as between the substrate and the source. These lower capacitances are available as well by virtue of the fact that the substrate is brought via a pin 406 of FIG. 4 to a point external to the device.

While the above describes the preferred embodiment of the invention, various modifications/additions will be apparent to those of skill in the art. More specifically, the arrangements utilized both externally and internally with respect to the present invention may vary. The sense pin 406 or 511 bringing the substrate 201 outside the chip may be connected to a variety of different capacitors, resistors or other electronic components. The control circuitry for varying operation of the device based upon measured parameters may vary from that shown herein, and other uses of the sense pin may be employed by those of ordinary skill in the art. All of the foregoing are intended to be covered by the following claims.

What is claimed is:

1. A method of measuring the change in voltage across an inherent capacitor in an SOI device having a substrate and a source, said method comprising the steps of connecting an external portion of said device directly to said substrate, and measuring electrical signals on said external portion.

2. The method of claim 1 wherein an additional electrical component internal to said SOI device is connected between said substrate and said source.

3. The measuring method of claim 2 wherein said internal electrical component is a capacitor or a resistor which together with the inherent capacitor form a voltage divider.

4. The measuring method of claim 3 wherein said step of measuring electrical signals comprises connecting an electric measuring apparatus between said external portion of the SOI device and ground.

5. The measuring method of claim 1 further comprising:
applying a current to the SOI device so as to affect an electric parameter related to said inherent capacitor.

6. The measuring method of claim 1 further comprising:
connecting a capacitor external to the SOI device between said external portion of the SOI device and ground so as to form a capacitive voltage divider.

7. The measuring method of claim 1 wherein said step of measuring electrical signals comprises connecting an electric measuring apparatus between said external portion of the SOI device and ground.

8. The measuring method of claim 1 wherein said SOI device further comprises a drain and said inherent capacitor is the inherent capacitance between the drain and substrate of the SOI device.

9. The measuring method of claim 1 wherein the SOI device comprises first and second transistors connected in series and adapted to be connected between a source of voltage and ground so as to form a voltage divider circuit with a common junction point between a source of the first transistor and a drain of the second transistor, and said inherent capacitor is the inherent drain/substrate capacitor.

10. The measuring method of claim 1 further comprising an external electric circuit coupled to said external portion of the SOI device to form an overall circuit that includes said inherent capacitor as a component thereof.

11. The measuring method of claim 1 wherein said substrate is connected electrically to an external pin and is not connected to said source.

12. The measuring method of claim 1 wherein a small tab on the outside of the SOI device is connected to the substrate so ast o facilitate said connecting step.

13. A method of measuring electrical activity in a device having a source, a gate, a drain, and a substrate, the method comprising:
connecting a measuring device between the substrate and ground;
measuring, with said measuring device, a rate of change of a signal present on said substrate, and
adjusting operation of said device based upon said step of measuring.

14. The method of claim 13 wherein said step of adjusting includes processing by a logic gate.

15. The measuring method of claim 13 wherein an additional electrical component internal to said device is connected between said substrate and said source, and
said adjusting step includes processing a signal at said substrate and feeding back a processed signal to the gate of the device.

16. The measuring method of claim 13 wherein said device comprises an inherent capacitor between the drain and substrate.

17. The measuring method of claim 16 wherein an additional electrical component internal to said device is connected between said substrate and said source.

18. The measuring method of claim 17 wherein said internal electrical component is a capacitor or a resistor which together with the inherent capacitor form a voltage divider.

19. The measuring method of claim 13 further comprising:
applying a DC voltage to the drain of the device and a signal to the gate of the device.

* * * * *